(12) United States Patent
Icking et al.

(10) Patent No.: US 7,183,804 B2
(45) Date of Patent: Feb. 27, 2007

(54) PROCESS AND DEVICE FOR OUTPUTTING A DIGITAL SIGNAL

(75) Inventors: Henrik Icking, München (DE); Manfred Mauthe, Grosshelfendorf (DE)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 10/723,256

(22) Filed: Nov. 26, 2003

(65) Prior Publication Data

US 2004/0155680 A1    Aug. 12, 2004

(30) Foreign Application Priority Data

Nov. 28, 2002 (DE) .............................. 102 55 642

(51) Int. Cl.
*H03K 19/0175* (2006.01)
*H03B 1/00* (2006.01)
*H03F 3/45* (2006.01)

(52) U.S. Cl. ............................ 326/86; 326/26; 326/27; 326/127; 327/108; 330/253

(58) Field of Classification Search ............ 326/21–27, 326/30, 83, 86; 327/108, 109, 112, 309, 327/312, 321, 543, 65, 69; 330/146, 253
See application file for complete search history.

(56) References Cited

U.S. PATENT DOCUMENTS

| | | | | |
|---|---|---|---|---|
| 4,264,872 A | * | 4/1981 | Suzuki | 330/253 |
| 5,767,699 A | * | 6/1998 | Bosnyak et al. | 326/86 |
| 6,005,438 A | * | 12/1999 | Shing | 330/253 |
| 6,107,882 A | * | 8/2000 | Gabara et al. | 330/253 |
| 6,111,431 A | * | 8/2000 | Estrada | 326/83 |
| 6,175,255 B1 | * | 1/2001 | Mohan | 327/108 |
| 6,313,662 B1 | * | 11/2001 | Ide | 326/83 |
| 6,356,141 B1 | * | 3/2002 | Yamauchi | 327/543 |
| 6,369,621 B1 | | 4/2002 | Tinsley et al. | |
| 6,459,323 B2 | * | 10/2002 | Birkeli | 327/333 |
| 6,646,482 B2 | * | 11/2003 | Takeuchi | 327/112 |
| 6,696,852 B1 | * | 2/2004 | Brunolli | 326/30 |
| 6,700,420 B2 | * | 3/2004 | Spehar | 327/141 |
| 6,895,535 B2 | * | 5/2005 | Sunter et al. | 714/704 |

FOREIGN PATENT DOCUMENTS

DE    29 29 450 C2    8/1985
EP    938 187 A1    8/1999

* cited by examiner

*Primary Examiner*—Vibol Tan
(74) *Attorney, Agent, or Firm*—Brinks Hofer Gilson & Lione

(57) ABSTRACT

To output a digital signal in particular according to the LVDS (low voltage differential signalling) standard, a driver stage is supplied with a constant current and thus supplies the digital signal in the form of a current signal with defined current values. As a result of line capacitances of a transmission line, because of the current limited according to the standard the edge steepness and hence the maximum transmittable bit rate can deteriorate. According to the invention, therefore, at least essentially in synchronization with a triggering of the driver stage, at least one current increase signal is generated which via a capacitor causes an additional current increase in the output current of the driver stage. Preferably, the current increase signal via the respective capacitor is switched directly to an output of the driver stage. By using a capacitor, with very little expenditure a limited current pulse can be switched in a temporally targeted manner on the switching processes of the driver stage.

20 Claims, 2 Drawing Sheets

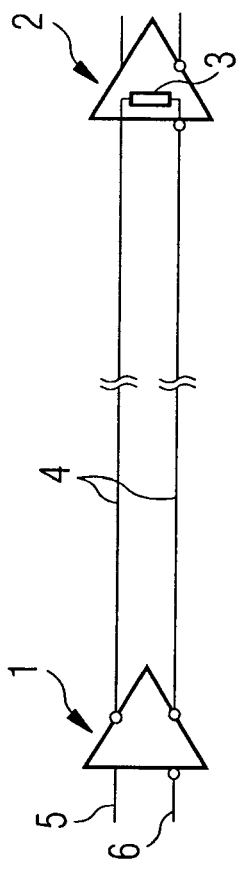
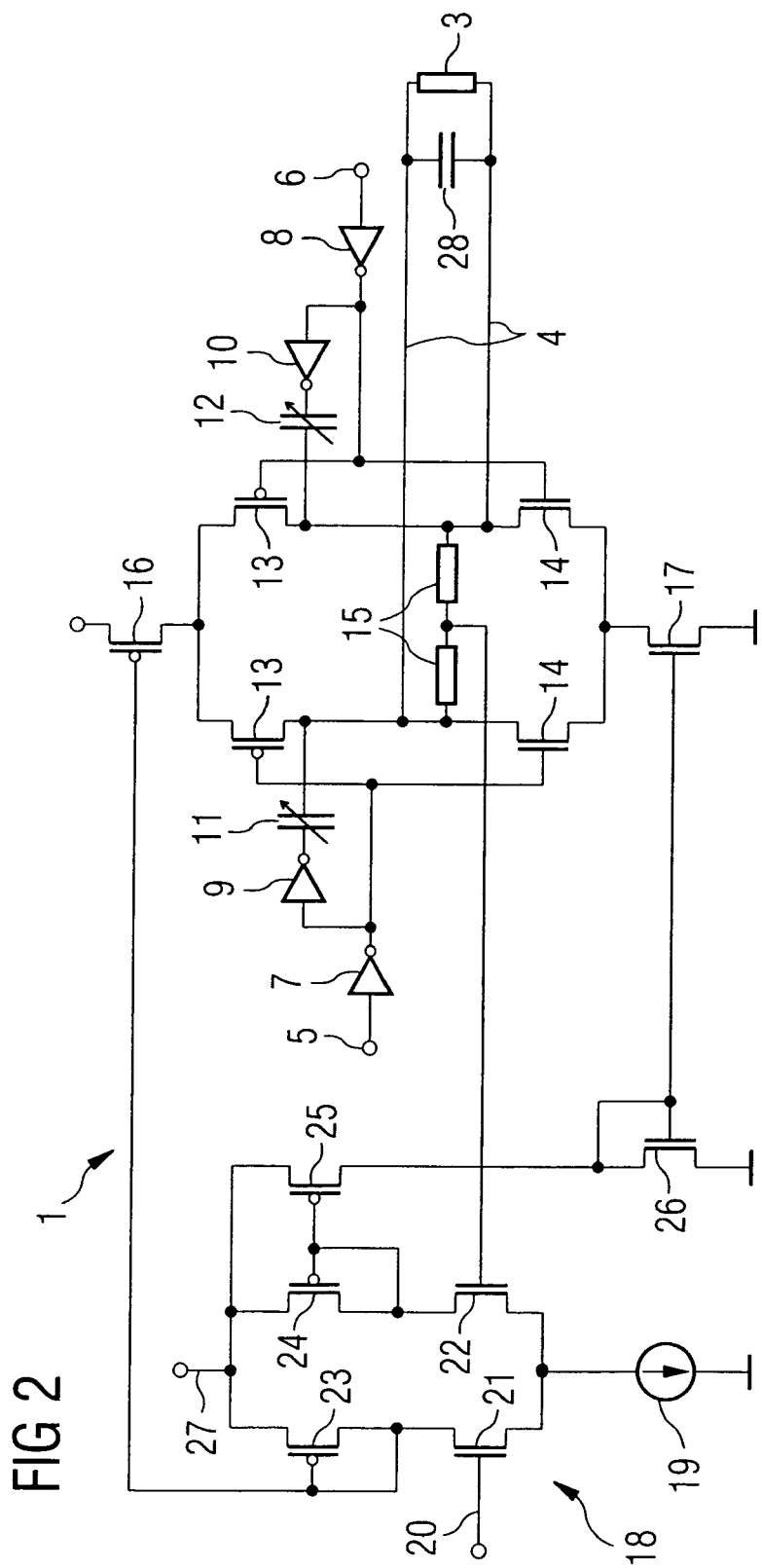
FIG 1
FIG 2

PROCESS AND DEVICE FOR OUTPUTTING A DIGITAL SIGNAL

BACKGROUND OF THE INVENTION

The present invention relates to a process and a device designed to perform the process for outputting a digital signal, in particular in a digital signal transmission according to LVDS transmission standard in which a differential signal of low voltage and limited current is used.

Applicants claim priority to German Application No. 102 55 642.3, filed Nov. 28, 2002, the entire application of which is incorporated by reference.

U.S. Pat. No. 6,288,581 B1 discloses an LVDS output driver in which the positive and the negative signals of the differential output signal are each generated by a main complementary end stage, wherein the two main complementary end stages are connected in parallel and triggered in counter-phase. Allocated to each of the two main complementary end stages is an auxiliary complementary end stage, the output of which can be connected with the output of the allocated main complementary end stage and controlled in synchrony with the allocated main complementary end stage. At each edge of the control signals to trigger the main complementary end stages, for short periods the outputs of the auxiliary complementary end stages are connected with those of the main complementary end stages to increase briefly the output current after a signal change and thus improve the edge steepness. In each case, the two main complementary end stages and the two auxiliary complementary end stages are connected in parallel and together receive a constant current to limit the output current to a current limit value. Disadvantageously, this output driver requires a high circuit complexity as the driver circuit must be provided in duplicate and in addition the connection elements with the necessary control logic are required for connecting the outputs of the auxiliary complementary end stages and the main complementary end stages.

Furthermore, U.S. Pat. No. 6,281,715 B1 discloses an LVDS driver in which a positive and a negative output of a differential output signal are each generated by a complementary end stage, the two complementary end stages being controlled in counter-phase, connected in parallel and exposed jointly to a constant current in order to limit the current of the differential output signal. The constant current for application to the parallel circuit of the two complementary end stages can be briefly increased by means of additional current switching elements on each edge of the trigger signal of the two complementary end stages. Disadvantageously, this requires an increased circuit complexity for the additional current switching elements, an equally necessary additional current source and a device for temporally correct triggering of the circuit switching elements to supply the additional current.

BRIEF SUMMARY OF THE INVENTION

The present invention is based on the object of creating a process and a device for transmission of digital signals in the form of a current signal of defined current intensity, wherein the edge steepness can be improved with little expense.

According to the invention, this object is achieved by a process with the features of claim 1 and by a device with the features of claim 11. The sub-claims each define preferred and advantageous embodiments of the present invention.

According to the invention, at least essentially in synchrony with the edges of the control of the driver circuit, a current increase signal is generated which causes the current increase via a capacitor. The use of the capacitor limits the supplied current quantity or charge so that the additional period for which the current increase pulse is active is not critical. This allows the possibility of deriving the current increase signal directly from a control signal to trigger the driver stage so that advantageously no additional switching device is required to generate the current increase signal. Furthermore, the use of at least one capacitor for a temporary increase in current achieves a potential separation so it is possible to disregard voltage differences between the increase signal and the point at which the current increase is achieved by means of the capacitor.

The at least one increase signal can achieve the current increase via the at least one capacitor in various ways. Firstly, to supply current to the driver circuit at least one controllable current source can be provided which receives the increase signal via the capacitor. In an advantageous embodiment, however, the increase signal acts via a capacitor directly on an output line or output connection of the driver circuit. In the case of a driver circuit which emits a differential output signal via two output lines, two increase signals can be provided which each act directly on one output line via a capacitor. The additional current increase caused by the increase signal is in this case applied to both output lines. Here, it is also conceivable that only one of the two output lines receives an increase signal via a capacitor if, for example, the two output lines have to drive different load capacitances and only one output line requires an additional current to achieve a required edge steepness.

The at least one capacitor can be variable in its capacitance in order for example to vary the additional current applied and adapt to the requirements. With one differential output signal and two capacitors, the capacitance of these can be varied independently. For example, each capacitor can be formed by a parallel circuit of connectable part capacitors.

Preferably, each increase signal used is derived from a control signal to trigger the driver stage. When the control signal for the driver stage is supplied by a trigger driver which can supply an adequate output current, the increase signal can be taken directly from the line via which the control signal is passed. Preferably, however, the increase signal is generated by its own driver which can be inverting or non-inverting. A driver for an increase signal can be able to be switched on and off in order optionally to switch on an additional current. In principle, the polarity of the increase signal must be selected so that the current which is additionally switched in its polarity via the capacitor corresponds to that of the output connection of the driver stage to which the increase signal is applied. A driver stage for the increase signal can be connected in parallel to a driver stage to generate a control signal or in series after a driver stage to generate a control signal.

Advantageously, the increase signal is connected a short time after a edge of the control signal in order to ensure that the switch elements of the driver stage have already assumed the new switch status before the arrival of the additional current signal connected because of the increase signal via the capacitor. Otherwise, there is a risk that the current pulse triggered by the increase signal would behave in the opposite sense to the current supplied by the driver stage. This preferred time delay can be achieved if the increase signal is generated by a driver which is connected in series with a driver to generate the control signal. If the two drivers to generate the control signal and the current increase signal are connected in parallel, the driver for the increase signal can have a greater time delay than the driver for the control signal in order to create the desired time delay for the increase signal.

As a load shift takes place at the capacitor output on connection of both a positive and a negative edge to the capacitor, preferably both positive and negative edges of the increase signal are at least essentially synchronized with the edges of the control signal. If the increase signal is derived from a control signal, this requirement is fulfilled automatically with no extra expenditure.

The voltage increase of the increase signal is independent of a voltage increase of the output signal, wherein the greater the voltage increase of the increase signal is, the smaller the capacitance of the capacitors can be selected. As the invention is used in particular in an LVDS data transmission in which the voltage increase of the driver stage is low, advantageously for the increase signal a greater voltage increase is used so that the capacitors can be designed small.

The driver circuit has preferably for each of the positive and negative output connections a series circuit of two current switch elements which receive a voltage in series, are controlled in opposite directions and with their node point are connected to the appropriate output connection. The two current switch elements can be two complementary transistors which are together triggered by a control signal. Also, two transistors of the same type can be used, one of which is triggered directly by the control signal and the other by the control signal via an inverter. To generate a differential output signal, two such series circuits are required which are connected in parallel.

With a single-ended output with just one series circuit of two current switch elements, at both ends of the series circuit current limiting elements must be provided in order to limit the output current in the two switch states of the series circuit. With a driver stage with two parallel-connected series circuits each of two current circuit elements to provide a differential output stage which is terminated with a resistor and which leads to a current loop, one current limiting element on the positive or negative current supply connection of the driver stage is sufficient as in this case the current flows in to the resistor via one output line and back to the driver circuit via the other output line.

Preferably, however, a controllable current limiting element is provided on both the positive and the negative current supply connections of the driver stage. Using a suitable control system, by influencing the two current limiting elements which, for example, can be transistors, both the current flowing via the differential output line and the voltage level of the two output lines can be influenced and in particular controlled. In order to be able to determine the voltages at the output lines of a differential driver stage for control purposes, the two output connections of the differential driver stage can be connected together via a series circuit of two resistors which have the same resistance. At the node point of the two resistors, the mean value of the voltages at the two output lines of the driver stage can now be measured. Preferably, a combined control system is used which firstly adjusts the mean value of the voltages at the output lines to a reference voltage, in particular constant, and secondly ensures that the current flowing through the driver stage is equal to the current of a reference current source, for which a current mirror can be provided.

The invention is now described below with reference to a preferred embodiment example using the enclosed drawings.

BRIEF DESCRIPTION OF DRAWINGS

FIG. 1 shows the schematic structure of a transfer line to LVDS standard, and FIG. 2 shows the circuit structure of an LVDS driver for output of a digital signal in the line according to FIG. 1.

DETAILED DESCRIPTION OF THE INVENTION

Figure 3:
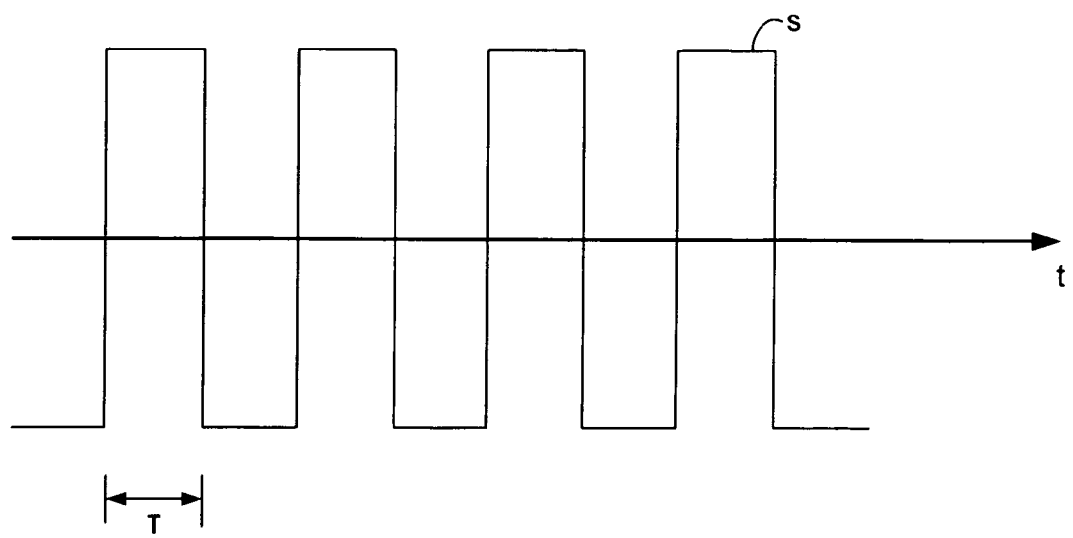
FIG. 3 is a timing diagram showing a digital signal and a time constant which is shorter than the minimum period of the digital signal.

The data transmission line shown in FIG. 1 works on the LVDS (low voltage differential signalling) standard which uses a differential signal of low voltage. The unidirectional LVDS transmission standard uses a differential signal of 250–400 mV and is therefore low in power and suitable for high data rates. At the end of two transmission lines 4, a resistor of approximately 100 Ω is provided in a receiver 2. The transmitter 1 has an inverting input 6 and a non-inverting input 5.

In the LVDS transmitter 1, a constant current of 3–4 mA is switched through a bridge circuit. At terminal resistor 3 there then results a differential signal of ±400 mV. However, the transfer lines 4 can have a particular line capacitance depending on the application site, which for example can be the connection of an integrated circuit with an integrated circuit or the connection of a circuit board with another circuit board. Together with the terminal resistor 3, this gives an RO time constant which limits the maximum speed or bit rate. So that the level can settle at the end value, the RC time constant should not exceed one-third of the signal duration. FIG. 3 is a timing diagram showing a digital signal and a time constant which is shorter than the minimum period of the digital signal. In FIG. 3. s is a general digital signal. A time constant τ is shorter than the minimum period of the digital signal s.

In order to achieve an increase time of 300 ps under the given conditions, the load capacitance must not exceed 3 pF if a maximum current of 4 mA is available. If the load capacitance is greater, during switching a higher current must flow in in order not to extend the increase time.

FIG. 2 shows the circuit construction of the transmitter 1 in detail. The core of the transmitter 1 is a driver circuit which comprises two parallel-connected series circuits each of a PMOS transistor 13 and an NMOS transistor 14. The two series circuits are connected in parallel at their ends and connected with a positive supply voltage connection at the ends lying on the side of the PMOS transistor 13 via a PMOS transistor 16 and with a negative supply voltage connection at the opposite ends via an NMOS transistor 17. The two transistors 16, 17 for current supply to the driver stage 13, 14 are triggered by a control circuit 18 which ensures amongst others that a constant current flows through the driver stage 13, 14, the function of which is described later.

The gate connections of the two transistors 13, 14 each connected in a series circuit are triggered jointly by a control driver 7, 8, where the input of the control driver 7 is the non-inverting input 5 of the transmitter 1 and the input of the control driver 8 is the inverting input 6 of the transmitter 1. Consequently, the node point of the series-connected transistors 13, 14 triggered by the control driver 7 constitutes the non-inverting output connection and conversely the node point between the transistors 13, 14 triggered by the control driver 8 is the inverting output connection of the differential output point. The two output connections of the differential output act on the connection lines 4, which as previously stated have a line capacitance 28 and at their end are connected together via a terminal resistor 3 which is on the receiver side.

The two control drivers 7, 8 furthermore each control one of two inverting current increase drivers 9, 10 which at their output each supply a current increase signal. The outputs of the two current increase drivers 9, 10 are each connected via one of two capacitors 11, 12 with the node point of the series circuit of the transistors 13, 14 which are triggered by the control drivers 7, 8 triggering the respective current increase drivers 9, 10.

The function of the driver stage 13, 14 depicted will be described below. A positive edge at the non-inverting input 5 gives a falling edge at the output of the control driver 7 and thus causes the PMOS transistor 13 of the left series circuit to conduct and the NMOS transistor 14 of the left series circuit to block, and hence at the node point of the left series circuit a positive edge appears. The same behaviour occurs in the right series circuit when triggered via the inverting input 6. On operation of the driver circuit it must be ensured that the signals switched to the two inputs 5, 6 of the transmitter are in counter-phase or complementary to each other.

The negative edge at the output of the control driver 7 is also present at the current increase driver 9 and at its output causes a positive edge with time delay, where the time delay depends on the signal run time in the current increase driver 9. The positive edge at the output of the current increase driver 9 is switched differentiated via the capacitor 11 to the node point of the left series circuit, whereby into this node point is supplied a short charge pulse which depends on the voltage increase at the output of the current increase driver 9 and on the capacitance of the capacitor 11. Thus, at the start of the switching process in the node point of the left series circuit there flows both the constant current passed via the control circuit 18 and the two transistors 16, 17 through the driver stage 13, 14 and the current pulse additionally supplied via the capacitor 11.

In the next switching process the non-inverting input 5 receives a negative edge which leads to a positive edge at the output of the control driver 7 and hence a blocking of the PMOS transistor 13 of the left series circuit and conduction of the NMOS transistor 14 of the left series circuit, whereby a negative edge appears at the node point of the left series circuit. The positive edge at the output of the control driver 7 causes, with time delay, at the output of the current increase driver 9, a negative edge which in turn passes differentiated via the capacitor 11 a current pulse to the node point of the left series circuit, the current pulse in this case having the reversed sign, so that in addition to the constant current generated via the control circuit 18 together with the transistors 16, 17, there flows into the node point of the left series circuit the current pulse flowing via the capacitor 11 as a result of the negative edge at the output of the current increase driver 9.

As a result, in this way the edge steepness is improved and hence the maximum transmittable bit rate increased with very little expenditure which is limited to two additionally required drivers 9, 10 and two additional capacitors 11, 12.

The control circuit 18 and its function are described below. The control circuit 18 comprises a constant current source 19 and a reference voltage connection 20 which receives a constant voltage. The two NMOS transistors 21, 22 together with the two PMOS transistors 23, 24 form a differential amplifier, the first input of which is formed by the gate of the NMOS transistor 21 and receives the reference voltage 20, and the second input of which is formed by the gate of the second NMOS transistor 22. The second input of the resulting differential amplifier receives the mean value of the voltage at the two output connections of the driver stage 13, 14. To this end, the two output connections of the driver stage 13, 14 which correspond to the node points of the two series circuits of transistors 13, 14 are connected together via a series circuit of two resistors 15 which have the same resistance. At the connection point between the two resistors 15, the mean value of the voltages at the output connections is measured and passed to the second input of the differential amplifier 21–24.

In addition, the part current flowing via the PMOS transistor 23 to the PMOS transistor 16 is reflected at the positive supply voltage connection of the driver stage 13, 14. In addition, the part current flowing through the PMOS transistor 24 via a converter circuit with two transistors 25, 26 to the NMOS transistor 17 is reflected at the negative supply voltage connection of the driver stage 13, 14 so that firstly the mean value of the voltages on the output lines 4 measured at the node point of the series circuit of the two resistors 15 is adjusted to the reference voltage at the reference voltage input 20, and secondly the current reflection achieves a constant current through the two parallel-connected series circuits of the transistors 13, 14.

The control circuit 18 thus contains a closed control loop which adjusts the mean value of the voltages at the two output connections of the driver stage 13, 14 to the voltage lying at the reference voltage input 20, which simultaneously ensures that the current through the driver stage 13, 14 corresponds to a given constant value.

The invention claimed is:

1. A method for outputting a digital signal at a circuit output, the method comprising the steps of:
    supplying a driver stage with a current via a positive and a negative current supply connection;
    limiting the current to a current limit value via a positive and/or negative current supply connection; and
    temporarily increasing the current flowing via an output of the driver stage in synchronization with the edges of at least one trigger signal of the driver stage, wherein the increased current is provided via a capacitor coupled between an input and the output to increase the output current of the driver stage, the capacitor being essentially directly coupled to the circuit output.

2. The method according the claim 1, further comprising a step of the driver stage supplying a differential output signal at two output lines wherein at least one of the two output lines receives the increase signal.

3. The method according to claim 1, wherein the step of providing the increase signal comprises providing the increase signal generated with a time delay to the corresponding edge of the at least one trigger signal of the driver stage.

4. The method according to claim 3, wherein the step of providing the increase signal comprises providing the increase signal generated by an inverting or a non-inverting driver which receives a control signal at its input.

5. The method according to claim 1, wherein the step of increasing the current comprises increasing the current via a capacitor having a variable capacitance.

6. The method according to claim 1, wherein the step of increasing the current via the capacitor comprises providing a current having a voltage increase which is greater than the voltage increase of the output signal of the driver stage.

7. The method according to claim 1, wherein the step of supplying the driver stage with a current comprises providing a constant current.

8. The method according to claim 1, further comprising a step of the driver stage supplying a differential output signal at two output lines wherein the current flowing via the positive supply connection and the current flowing via the negative current supply connection are controlled such that the mean value of the voltages of the two output lines assumes a controlled constant value.

9. The method according to claim 1, wherein the step of supplying the driver stage with a current comprises supplying the driver stage with current from a controllable current source via the positive and/or negative current supply connection and at least one controllable current source receives an increased current via the capacitor.

10. The method according to claim 9, wherein the output of the capacitor is terminated with a terminal resistor and the capacitance of the capacitor together with the terminal resistance forms a time function element, the time constant of which is less than the minimum period occurring in the digital signal to be output between two successive edges of a control signal.

11. A device for outputting a digital signal at a circuit output, the device comprising:
   a driver stage receiving a supply current via a positive and a negative current supply connection, wherein the current via the positive and/or negative current supply connection is limited to a current limit value;
   a current increase signal increasing the current flowing via an output of the driver stage in synchronization with the edges of at least one control signal of the driver stage; and
   a capacitor coupled between an input and the output and essentially directly coupled to the circuit output, the capacitor generating an increased current to increase the output current of the driver stage.

12. The device according to claim 11, wherein the driver stage is designed such that it supplies a differential output signal at two input lines;
   wherein the two output lines are connected to a capacitor to receive the increased current via the capacitor.

13. The device according to claim 11, wherein the device generates at least one current increase signal with a time delay to the corresponding edge of the at least one trigger signal of the driver stage.

14. The device according to claim 13, wherein the device comprises an inverting driver and a non-inverting driver which receives a control signal at its input for generating the at least one increase signal.

15. The device according to claim 11, wherein the at least one capacitor has a variable capacitance.

16. The device according to claim 11, wherein the voltage increase of the increase signal is greater than the voltage increase of the output signal of the driver stage.

17. The device according to claim 11, further comprising controlling means for controlling the current flowing via the positive and/or negative current supply connection to a constant value.

18. The device according to claim 11, wherein the driver stage supplies a differential output signal at two output lines and wherein the device further comprises controlling means for controlling the current flowing via the positive supply connection and the current flowing via the negative current supply connection such that the mean value of the voltages of the two output lines assumes a controlled constant value.

19. The device according to claim 11, wherein the device further comprises a controllable current source for supplying the driver stage with current via the positive and/or negative current supply connection and at least one controllable current source which is connected to the capacitor to receive the current increase signal therefrom.

20. The device according to claim 19, wherein the output of the capacitor is terminated with a terminal resistor and the capacitance of the capacitor together with the terminal resistance forms a time function element, the time constant of which is less than the minimum period occurring in the digital signal to be output between two successive edges of a control signal.

* * * * *